United States Patent
Rho

(10) Patent No.: US 8,593,864 B2
(45) Date of Patent: Nov. 26, 2013

(54) NONVOLATILE MEMORY DEVICE AND METHOD OF PROGRAMMING THE SAME

(75) Inventor: Jun Rye Rho, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 10 days.

(21) Appl. No.: 12/765,349

(22) Filed: Apr. 22, 2010

(65) Prior Publication Data

US 2010/0315882 A1    Dec. 16, 2010

(30) Foreign Application Priority Data

Jun. 12, 2009  (KR) .................. 10-2009-0052258

(51) Int. Cl.
*G11C 11/4063*    (2006.01)

(52) U.S. Cl.
USPC .................. 365/185.03; 365/185.25

(58) Field of Classification Search
USPC ............ 365/185.03, 185.17, 185.24, 185.25
See application file for complete search history.

(56) References Cited

U.S. PATENT DOCUMENTS

| | | | | |
|---|---|---|---|---|
| 6,011,716 A | * | 1/2000 | Banks | 365/185.03 |
| 6,049,494 A | * | 4/2000 | Sakui et al. | 365/203 |
| 6,243,290 B1 | * | 6/2001 | Kurata et al. | 365/185.03 |
| 6,259,627 B1 | * | 7/2001 | Wong | 365/185.21 |
| 6,266,270 B1 | * | 7/2001 | Nobukata | 365/185.03 |
| 6,882,567 B1 | * | 4/2005 | Wong | 365/185.03 |
| 7,715,230 B2 | * | 5/2010 | Kim et al. | 365/185.03 |
| 2004/0027904 A1 | * | 2/2004 | Morikawa | 365/222 |
| 2009/0097313 A1 | * | 4/2009 | Park et al. | 365/185.03 |
| 2010/0091575 A1 | * | 4/2010 | Kim | 365/185.25 |

FOREIGN PATENT DOCUMENTS

| | | |
|---|---|---|
| KR | 1020070004295 | 1/2007 |
| KR | 1020070023174 | 2/2007 |

* cited by examiner

*Primary Examiner* — Douglas King

(74) *Attorney, Agent, or Firm* — IP & T Group LLP

(57) ABSTRACT

A nonvolatile memory device includes a memory cell array including a number of memory cells coupled to a selected bit line, a bit line selection unit configured to select and precharge the selected bit line, and a potential control unit configured to control a voltage level of the precharged bit line in response to a voltage level corresponding to a value of program data.

11 Claims, 3 Drawing Sheets

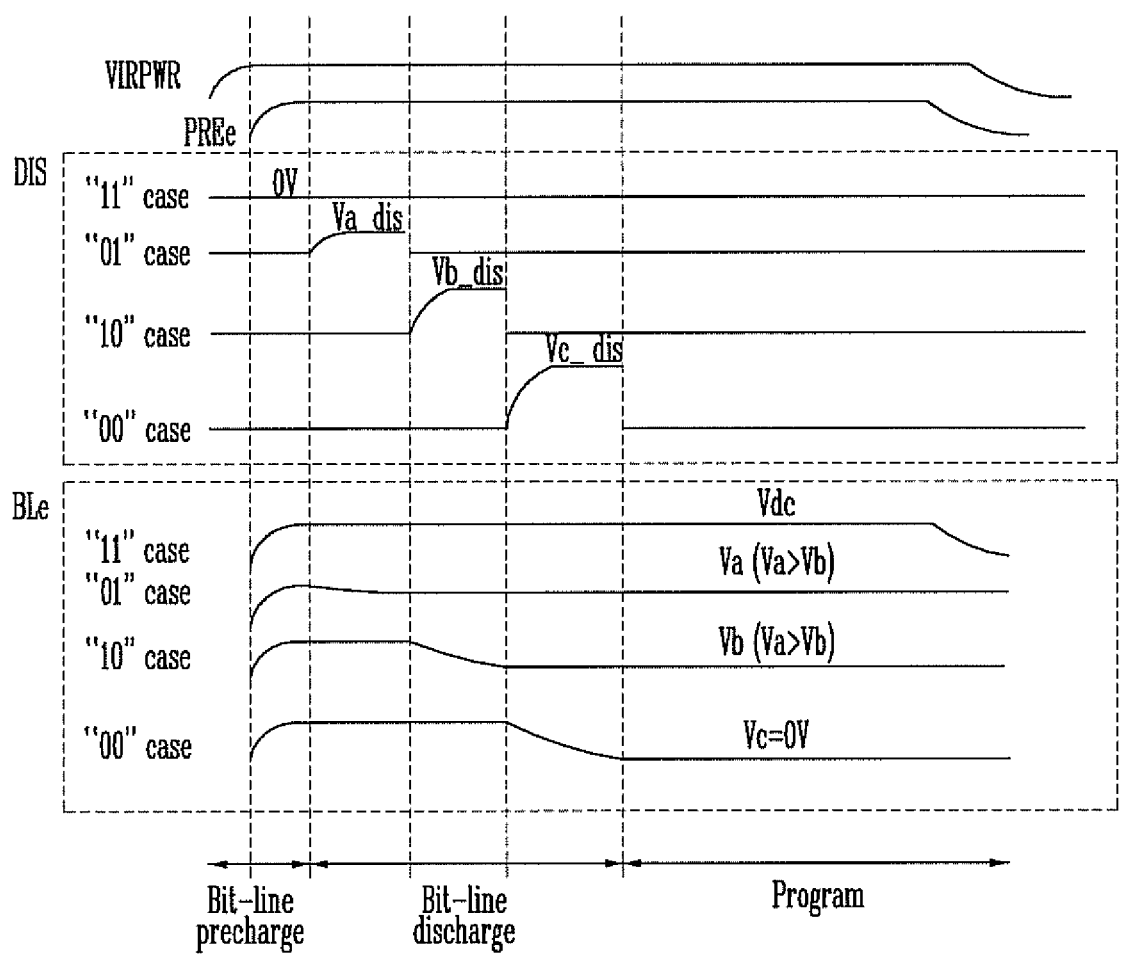

NONVOLATILE MEMORY DEVICE AND METHOD OF PROGRAMMING THE SAME

CROSS-REFERENCE TO RELATED APPLICATION

Priority to Korean patent application number 10-2009-0052258 filed on Jun. 12, 2009, the entire disclosure of which is incorporated by reference herein, is claimed.

BACKGROUND

Exemplary embodiments relate to a nonvolatile memory device and a method of programming the same and, more particularly, to a nonvolatile memory device and a method of programming the same, which are capable of reducing the time for performing a program operation.

Semiconductor memory devices may be classified into random access memory (RAM) devices, such as dynamic random access memory (DRAM) and static random access memory (SRAM) which are volatile (i.e., data stored in the memory devices are lost after a lapse of a certain time) and are fast in a rate of data input and output, and nonvolatile memory devices which retain data once the data are stored therein.

In the nonvolatile memory devices, there has been an increasing demand for flash memory devices which enable the electrical input and output of data. The flash memory device can be electrically erased at high speed even without removing a circuit from a board. The flash memory device is advantageous in that it does not require the refresh function of retaining data and it has a low manufacturing cost per memory because the structure of a memory cell is simple.

The flash memory devices are typically classified into a NOR type and a NAND type. The NOR type flash memory is disadvantageous in terms of high integration because it requires one contact for two cells, but is advantageous in terms of high speed because it has a high cell current. The NAND type flash memory is disadvantageous in terms of high speed because it has a low cell current, but is advantageous in terms of high integration because a plurality of cells shares one contact. Accordingly, the NAND type flash memory devices have been in the spot-light as the next-generation memory devices with a rapid increase in the use of digital devices, such as MP3 players, digital cameras, mobile terminals, and auxiliary storage devices.

Recently, to further increase the degree of integration of the flash memory devices, active research is being carried out on a multi-bit cell capable of storing plural data in a single memory cell. This type of a memory cell is called a multi-level cell (MLC). A memory cell capable of storing a single bit is called a single level cell (SLC).

The MLC has been developed to store data of 2 bits, and an MLC capable of storing data of 4 bits or 8 bits is being developed. In the flash memory devices, distributions of the threshold voltages are subdivided with an increase in the number of bits. In general, the performance of the flash memory device may be better as the width of a distribution of the threshold voltages becomes narrower.

In general, in an MLC capable of storing data of 2 bits, when a program operation is performed, a least significant bit (LSB) data program operation is first performed and a most significant bit (MSB) data program operation is then performed. Furthermore, in an MLC capable of storing data of 4 bits or more (e.g., 8 bits or 16 bits), the number of program operations is increased in proportion to the number of bits. Accordingly, an MLC capable of storing many pieces of data is disadvantageous in that the time for performing a program operation is increased.

BRIEF SUMMARY

Exemplary embodiments relate to a nonvolatile memory device and a method of programming the same, wherein a program operation for an MLC can be completed at once without the need to separately perform an LSB program operation and an MSB program operation by controlling the voltage level of a bit line in response to each of a number of bit data using a potential control unit coupled to the bit line of a memory cell array.

A nonvolatile memory device according to an aspect of the present disclosure includes a memory cell array including a number of memory cells coupled to a selected bit line, a bit line selection unit configured to select and precharge the selected bit line, and a potential control unit configured to control a voltage level of the precharged bit line in response to a voltage level corresponding to a value of program data.

The bit line selection unit may select and precharge the selected bit line to a voltage level of a power source in response to a precharge signal.

The potential control unit may control the voltage level of the precharged bit line in response to a program data signal corresponding to the value of the program data.

The potential control unit may include a discharge signal generator configured to generate a discharge signal having a voltage level controlled in response to first and second program data signals corresponding to the value of the program data, and a discharge unit configured to discharge the voltage level of the precharged bit line in response to the discharge signal.

Each of the memory cells may be a multi-level cell (MLC) for storing a number of bit data.

When the value of the program data is "11", the precharged bit line may be discharged to a first voltage level. When the value of the program data is "01", the precharged bit line may be discharged to a second voltage level. When the value of the program data is "10", the precharged bit line may be discharged to a third voltage level. When the value of the program data is "00", the precharged bit line may be discharged to a fourth voltage level. Here, the first voltage level>the second voltage level>the third voltage level>the fourth voltage level.

The discharge signal generator may include a first transistor coupled between a power source voltage and an output node and configured to precharge the output node in response to a reset signal, a second transistor coupled between the output node and a ground power source and configured to discharge a voltage level of the output node in response to the first program data signal, and a third transistor coupled between the output node and the ground power source and configured to discharge a voltage level of the output node in response to the second program data signal.

During the same period of time, the amount of current discharged through the second transistor may be greater than that of current discharged through the third transistor.

When the value of the program data is "11", the discharge signal of a first logic level may be generated. When the value of the program data is "01", the discharge signal of a second logic level may be generated. When the value of the program data is "10", the discharge signal of a third logic level may be generated. When the value of the program data is "00", the discharge signal of a fourth logic level may be generated.

Here, the fourth logic level>the third logic level>the second logic level>the first logic level.

The nonvolatile memory device may further include a page buffer coupled to the bit line selection unit via a sense node.

The page buffer may include first and second latches each configured to store the program data. A program verification operation may be performed by comparing verification data and the program data stored in the first and second latches.

A method of programming a nonvolatile memory device according to another aspect of the present disclosure includes precharging a bit line coupled to a memory cell, controlling a voltage level of the precharged bit line in response to a voltage level corresponding to a value of program data, in response to a program data signal corresponding to the value of the program data, and supplying a program voltage to a word line coupled to the memory cell.

When the value of the program data is "11", the precharged bit line may be discharged to a first voltage level. When the value of the program data is "01", the precharged bit line may be discharged to a second voltage level. When the value of the program data is "10", the precharged bit line may be discharged to a third voltage level. When the value of the program data is "00", the precharged bit line may be discharged to a fourth voltage level. Here, the first voltage level>the second voltage level>the third voltage level>the fourth voltage level.

BRIEF DESCRIPTION OF THE DRAWINGS

FIG. 6 is a waveform showing the voltage levels of a discharge signal DIS and the voltage levels of a selected bit line (e.g., an even bit line) when a program operation for the nonvolatile memory device is performed according to an embodiment of this disclosure.

DESCRIPTION OF EMBODIMENTS

Hereinafter, exemplary embodiments of the present disclosure will be described in detail with reference to the accompanying drawings. The figures are provided to allow those having ordinary skill in the art to understand the scope of the embodiments of the disclosure.

Figure 1:
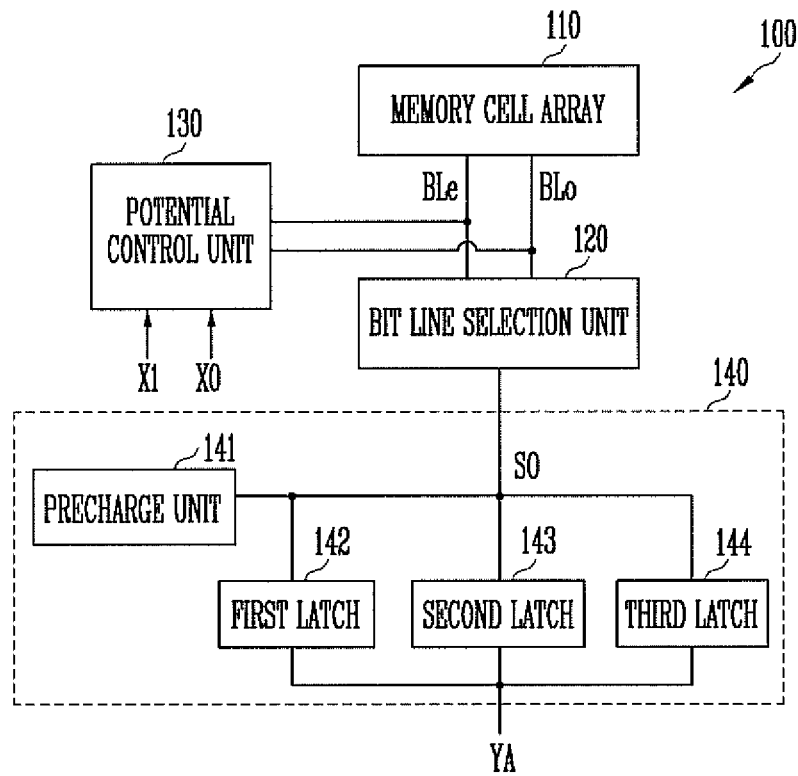
FIG. 1 shows a configuration of a nonvolatile memory device according to an embodiment of this disclosure.

FIG. 1 shows the configuration of a nonvolatile memory device according to an embodiment of this disclosure.

Referring to FIG. 1, the nonvolatile memory device 100 includes a memory cell array 110, a bit line selection unit 120, a potential control unit 130, and a page buffer 140.

The memory cell array 110 includes a number of memory cells. A number of the memory cells are coupled in series to an even bit line BLe or an odd bit line BLo.

The bit line selection unit 120 is coupled between the even and odd bit lines BLe and BLo, and the sense node SO of the page buffer 140. When a program operation is performed, the bit line selection unit 120 precharges a selected bit line (either the even bit line BLe or the odd bit line BLo) to a set voltage level Vdc. Further, when a verification operation is performed, the bit line selection unit 120 couples a selected bit line (either the even bit line BLe or the odd bit line BLo) to the sense node 50 and transfers verification data to the page buffer 140.

The potential control unit 130 is configured to control the voltage level of a selected bit line (either the even bit line BLe or the odd bit line BLo) in response to program data signals X0 and X1 so that the voltage level has a specific voltage level. In the case of an MLC capable of storing data of, for example, 2 bits, the potential control unit 130 can control the voltage level of a selected bit line so that it has four kinds of voltage levels.

The page buffer 140 includes a precharge unit 141 and first to third latches 142 to 144. The precharge unit 141 is coupled to the sense node SO, and is configured to precharge the sense node SO to a specific voltage level. The first to third latches 142 to 144 are coupled between the sense node 50 and an I/O node YA. When a verification operation is performed, the first to third latches 142 to 144 compare program data and verification data, and determine whether a program operation is a pass or a fail based on a result of the comparison.

Figure 2:
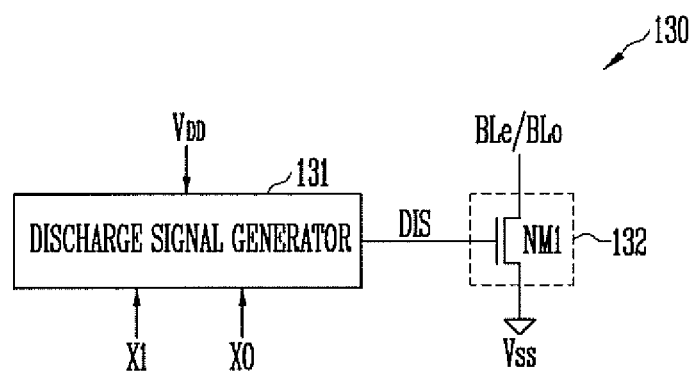
FIG. 2 is a detailed circuit diagram of a potential control unit according to an embodiment of this disclosure.

FIG. 2 is a detailed circuit diagram of the potential control unit 130 according to an embodiment of this disclosure.

The potential control unit 130 includes a discharge signal generator 131 and a discharge unit 132.

The discharge signal generator 131 is configured to output a discharge signal DIS having one of a number of voltage levels in response to the program data signals X0 and X1.

The discharge unit 132 can include an NMOS transistor NM1 coupled between a ground power source Vss and a selected bit line (either the even bit line BLe or the odd bit line BLo). The discharge unit 132 is configured to discharge a selected bit line (either the even bit line BLe or the odd bit line BLo), precharged to one specific voltage level, to another specific voltage level in response to a voltage level of the discharge signal DIS.

Figure 3:
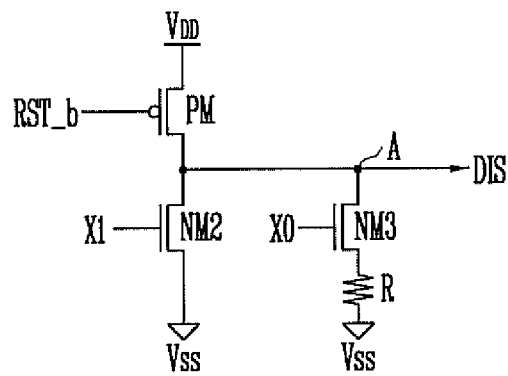
FIG. 3 is a circuit diagram of a discharge signal generator shown in FIG. 2.

FIG. 3 is a detailed circuit diagram of the discharge signal generator 131 shown in FIG. 2.

Referring to FIG. 3, the discharge signal generator 131 includes a PMOS transistor PM, NMOS transistors NM2 and NM3, and a resistor R. The PMOS transistor PM is coupled between a power source voltage $V_{DD}$ and an output node A, and is configured to precharge the output node A to the power source voltage $V_{DD}$ in response to a reset signal RST_b received for a certain period of time.

The NMOS transistor NM2 is coupled between the output node A and the ground power source Vss, and is configured to form a current path along which the voltage level of the output node A is discharged in response to the program data signal X1. The NMOS transistor NM3 and the resistor R are coupled in series between the output node A and the ground power source Vss. The NMOS transistor NM3 is configured to form a current path along which the voltage level of the output node A is discharged in response to the program data signal X0. Here, because of the resistor R, the amount of current discharged through the NMOS transistor NM2 is greater than the amount of current discharged through the NMOS transistor NM3. Accordingly, if the program data signals X0 and X1 are respectively supplied to the NMOS transistor NM3 and the NMOS transistor NM2 during the same period of time, the voltage level of the output node A is discharged by different amounts through the NMOS transistors NM2 and NM3. In this case, both NMOS transistors NM2 and NM3 control the voltage level of the discharge signal DIS.

Figure 4:
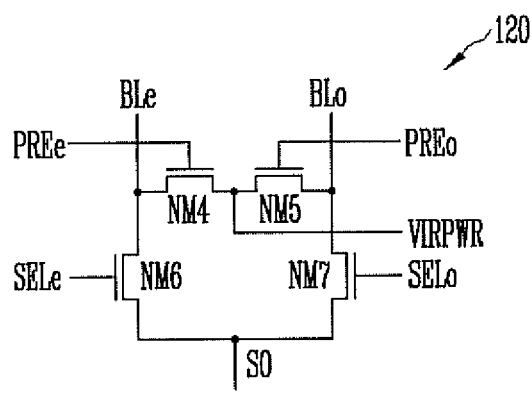
FIG. 4 is a detailed circuit diagram of a bit line selection unit shown in FIG. 1 according to an embodiment of this disclosure.

FIG. 4 is a detailed circuit diagram of the bit line selection unit 120 shown in FIG. 1 according to an embodiment of this disclosure.

Referring to FIG. 4, the bit line selection unit 120 includes a number of NMOS transistors NM4 to NM7. The NMOS transistors NM4 and NM5 are coupled to the respective even and odd bit lines BLe and BLo. The NMOS transistors NM4 and NM5 are configured to supply a power source VIRPWR to the even and odd bit lines BLe and BLo in response to respective precharge signals PREe and PREo, thereby precharging the even and odd bit lines BLe and BLo to a predetermined voltage level Vdc.

The NMOS transistors NM6 and NM7 are coupled between the sense node SO, and the even and odd bit lines BLe and BLo, and are configured to couple the even and odd bit lines BLe and BLo to the sense node SO in response to respective bit line selection signals SELe and SELo.

Figure 5:
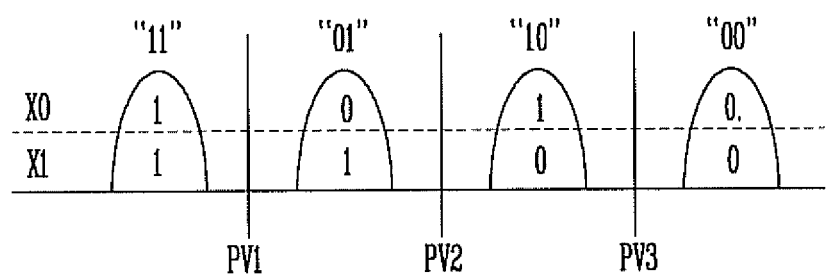
FIG. 5 is a graph illustrating program data signals in response to values of program data according to an embodiment of this disclosure.

FIG. 5 is a graph illustrating the program data signals X0 and X1 in response to values of program data according to an embodiment of this disclosure.

Referring to FIG. 5, a memory cell capable of storing 2 bits has four kinds of threshold voltages (i.e., "11", "01", "10", and "00"). Here, the program data signal X0 can be set as a signal using an LSB data value, and the program data signal X1 can be set as a signal using an MSB data value. For example, in the case in which a program operation is performed using program data (i.e., "10"), the program data signal X0 is generated as a signal of a logic low level, and the program data signal X1 is generated as a signal of a logic high level.

FIG. 6 is a waveform showing the voltage levels of the discharge signal DIS and the voltage levels of a selected bit line (e.g., the even bit line BLe) when a program operation for the nonvolatile memory device is performed according to an embodiment of this disclosure.

A program operation using the nonvolatile memory device according to an embodiment of this disclosure is described below with reference to FIGS. 1 to 6.

In the present embodiment, it is assumed that a memory cell on which a program operation will be performed is an MLC capable of storing data of 2 bits.

1) Bit Line Precharge Period

A bit line (e.g., the even bit line BLe) coupled to a memory cell to be programmed is precharged to a specific voltage level Vdc. In the precharge operation, the precharge signal PREe of a logic high level is supplied to the bit line selection unit 120 during a precharge period.

Thus, the power source VIRPWR of a logic high level is supplied to the even bit line BLe, thereby precharging the even bit line BLe to the specific voltage level Vdc.

2) Bit Line Discharge Period

The program data signals X0 and X1 corresponding to a value of program data supplied to the potential control unit 130. Here, if the value of the program data is "11", the program data signals X0 and X1 both having a logic high level are supplied to the potential control unit 130. If the value of the program data is "01", the program data signal X0 of a logic low level and the program data signal X1 of a logic high level are supplied to the potential control unit 130. Furthermore, if the value of the program data is "10", the program data signal X0 of a logic high level and the program data signal X1 of a logic low level are supplied to the potential control unit 130. If the value of the program data is "00", the program data signals X0 and X1 both having a logic low level are supplied to the potential control unit 130.

Accordingly, the discharge signal generator 131 generates the discharge signal DIS of a first voltage level of approximately 0 V when the value of the program data is "11", the discharge signal DIS of a second voltage level Va_dis when the value of the program data is "01", the discharge signal DIS of a third voltage level Vb_dis when the value of the program data is "10", and the discharge signal DIS of a fourth voltage level Vc_dis when the value of the program data is "00". The voltage levels of the discharge signal DIS are preferably related as follows: the first voltage level (e.g., 0 V)<the second voltage level Va_dis<the third voltage level Vb_dis<the fourth a voltage level Vc_dis.

The discharge unit 132 discharges the even bit line BLe, precharged to a logic high voltage level Vdc, to a certain voltage level, corresponding to the value of the program data, in response to the discharge signal DIS generated in response to the value of the program data. In other words, when the discharge signal DIS of the first voltage level 0 V is generated, the even bit line BLe maintains a logic high voltage level Vdc. When the discharge signal DIS of the second voltage level Va_dis is generated, the even bit line BLe is discharged to a voltage level Va. Furthermore, when the discharge signal DIS of the third voltage level Vb_dis is generated, the even bit line BLe is discharged to a voltage level Vb. When the discharge signal DIS of the fourth voltage level Vc_dis is generated, the even bit line BLe is discharged to a voltage level Vc. The voltage levels are preferably related as follows; Va>Vb>Vc>0V.

3) Program Period

After the voltage level of the even bit line BLe is controlled in response to the program data, a program operation is performed by supplying a program voltage to a word line coupled to the memory cell to be programmed. In this case, since the even bit line BLe has a different voltage level in response to a value of program data, the memory cell has a different distribution of the threshold voltages although the same program voltage is supplied to the word line.

A program verification operation according to an embodiment of this disclosure is described in short below. First, during the precharge and discharge periods of a bit line, LSB data and MSB data of the program data are respectively inputted to the first and second latches 142 and 143 of the page buffer 140. Here, the LSB data can be inputted to the first latch 142 and then stored in the second latch 143. Next, the MSB data can be inputted to the first latch 142.

Next, the bit line selection unit 120 transfers verification data of the memory cell to the sense node SO, and data transmitted to the sense node SO are stored in the second latch 143. Next, the verification operation is performed using the data stored in the first latch 142 and the second latch 143.

As described above, according to exemplary embodiments of the present disclosure, during a program operation for an MLC capable of storing a number of data bits, a program operation and a program verification operation can be completed at once without the need to divide program data into LSB data and MSB data. Accordingly, the time for operating a device can be reduced.

Furthermore, according to the present disclosure, the voltage level of a bit line is controlled in response to each of a number of bit data using the potential control unit coupled to the bit line of a memory cell array. Accordingly, a program operation for an MLC can be completed at once without the need to separately perform an LSB program operation and an MSB program operation.

What is claimed is:
1. A nonvolatile memory device, comprising:
a memory cell array including a number of memory cells coupled to a bit line;

a bit line selection unit connecting the bit line and a sense node, where the bit line selection unit is to precharge the bit line to a specific voltage level during a program operation in response to a precharge signal; and a potential control unit to receive a program data signal corresponding to a value of program data and to discharge the bit line to a voltage level, which is different than the specific voltage level, in response to the program data signal, where the voltage level corresponds to the value of the program data.

2. The nonvolatile memory device of claim 1, wherein the bit line selection unit selects and precharges the selected bit line to a voltage level of a power source in response to a precharge signal.

3. The nonvolatile memory device of claim 1, wherein the potential control unit controls the voltage level of the precharged bit line in response to a program data signal corresponding to the value of the program data.

4. The nonvolatile memory device of claim 1, wherein the potential control unit comprises:

a discharge signal generator configured to generate a discharge signal having a voltage level controlled in response to first and second program data signals corresponding to the value of the program data; and a discharge unit configured to discharge the voltage level of the precharged bit line in response to the discharge signal.

5. The nonvolatile memory device of claim 4, wherein the discharge signal generator comprises:

a first transistor coupled between a power source voltage and an output node and configured to precharge the output node in response to a reset signal;

a second transistor coupled between the output node and a ground power source and configured to discharge a voltage level of the output node in response to the first program data signal; and a third transistor coupled between the output node and the ground power source and configured to discharge a voltage level of the output node in response to the second program data signal.

6. The nonvolatile memory device of claim 5, wherein during a same period of time, an amount of current discharged through the second transistor is greater than that of current discharged through the third transistor.

7. The nonvolatile memory device of claim 4, wherein:

when the value of the program data is "11", the discharge signal of a first logic level is generated, when the value of the program data is "01", the discharge signal of a second logic level is generated, when the value of the program data is "10", the discharge signal of a third logic level is generated, and when the value of the program data is "00", the discharge signal of a fourth logic level is generated, wherein the fourth logic level>the third logic level>the second logic level>the first logic level.

8. The nonvolatile memory device of claim 1, wherein each of the memory cells is a multi-level cell (MLC) for storing a number of bit data.

9. The nonvolatile memory device of claim 1, wherein:

when the value of the program data is "11", the precharged bit line is discharged to a first voltage level, when the value of the program data is "01", the precharged bit line is discharged to a second voltage level, when the value of the program data is "10", the precharged bit line is discharged to a third voltage level, and when the value of the program data is "00", the precharged bit line is discharged to a fourth voltage level, wherein the first voltage level>the second voltage level>the third voltage level>the fourth voltage level.

10. The nonvolatile memory device of claim 1, further comprising a page buffer coupled to the bit line selection unit via the sense node.

11. The nonvolatile memory device of claim 10, wherein:

the page buffer comprises first and second latches each configured to store the program data, and a program verification operation is performed by comparing verification data and the program data stored in the first and second latches.

* * * * *